United States Patent [19]
Bothner et al.

[11] 4,205,548
[45] Jun. 3, 1980

[54] STAMPING TOOLS

[75] Inventors: Herbert Bothner, Warwick, N.Y.; John M. Frusco, Scotch Plains, N.J.; Dieter Spieth, New City, N.Y.

[73] Assignee: Plessey, Inc., New York, N.Y.

[21] Appl. No.: 921,450

[22] Filed: Jul. 3, 1978

[51] Int. Cl.² ............................................ B21D 28/06
[52] U.S. Cl. ...................................... 72/404; 72/335; 113/116 BB
[58] Field of Search ............... 72/335, 338, 404, 405, 72/407; 29/33 Q, 33 M, 417, 624; 113/116 P, 116 Y, 116 CC, 116 BB, 15 A

[56] References Cited
U.S. PATENT DOCUMENTS

| 1,964,584 | 6/1934 | Klocke | 72/404 |
|---|---|---|---|
| 3,154,972 | 11/1964 | Neumeier et al. | 72/404 |
| 3,292,412 | 12/1966 | Costabile | 72/405 |
| 3,580,200 | 5/1971 | Cvacho | 113/1 F |
| 3,762,205 | 10/1973 | Franz et al. | 113/116 P |
| 3,844,154 | 10/1974 | Bozek | 72/336 |
| 3,866,471 | 2/1975 | Carroll et al. | 72/405 X |
| 3,871,314 | 3/1975 | Stargell | 113/15 A |
| 4,141,712 | 2/1979 | Rogers | 65/36 |

Primary Examiner—Lowell A. Larson
Attorney, Agent, or Firm—James J. Burke, II

[57] ABSTRACT

Tools for stamping very delicate lead frames for semiconductor packages, including scored and bent-up tabs that retain groups of inner lead tips in position through subsequent operations, after which they are broken off. Sequential punch and die sets are used to (1) define the tabs, (2) bend down the leads, (3) score the tabs and coin the lead tips, and (4) bend the tabs up. At stations (3) and (4) means are provided to lift scored tabs out of the die and to allow the frame strip to move over the tab-bending die without interference.

6 Claims, 4 Drawing Figures

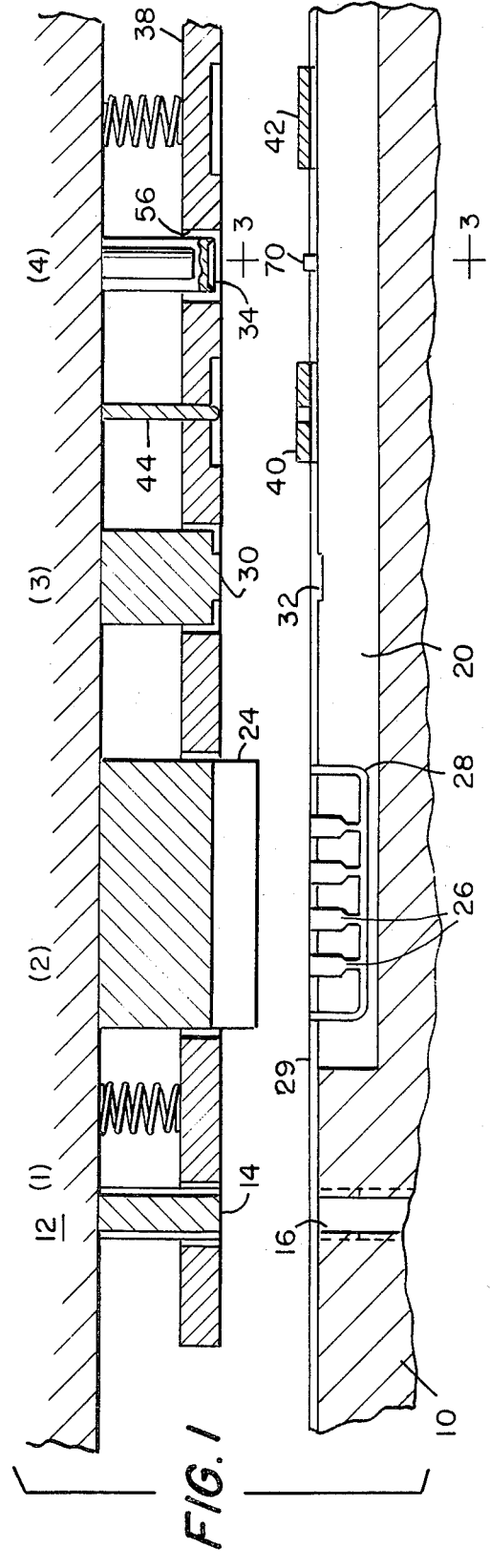
FIG. 1
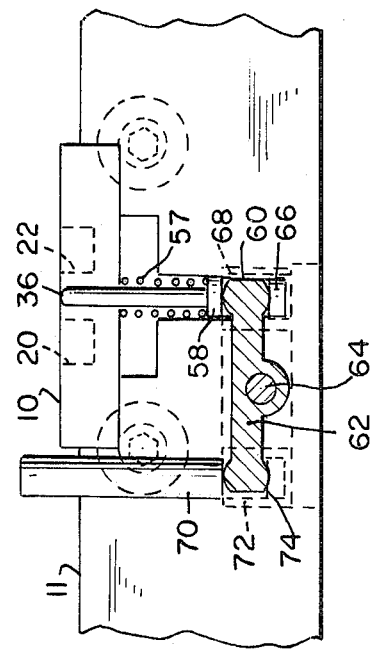
FIG. 3
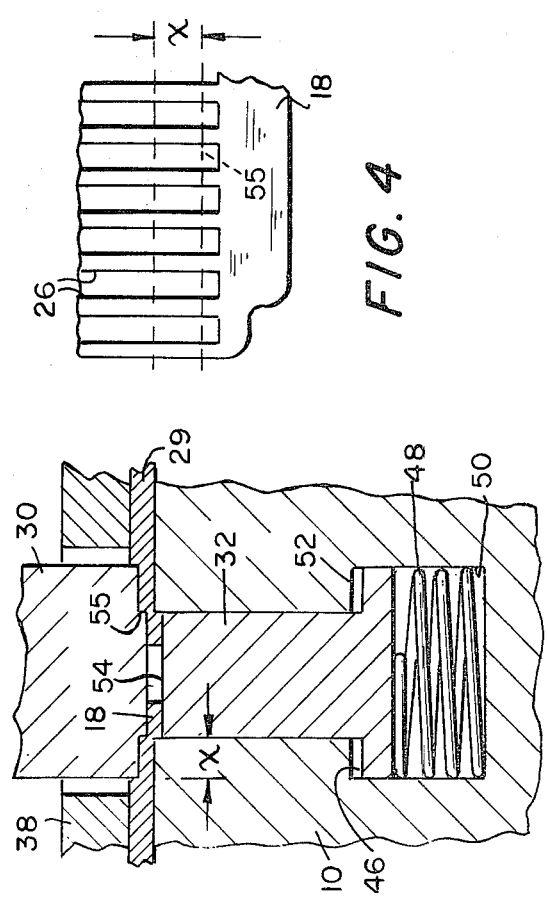
FIG. 2
FIG. 4

STAMPING TOOLS

BACKGROUND OF THE INVENTION

This invention relates in general to metal stamping and, more particularly, it relates to stamping very intricate parts in sequential dies, at a high rate of speed and with high precision. The invention has particular application in the production of lead frames used in the packaging of semiconductor integrated circuits.

In co-pending U.S. application Ser. No. 842,322, filed Oct. 14, 1977 and titled "Stamped Lead Frame For Semiconductor Packages", (now U.S. Pat. No. 4,137,546, issued Jan. 30, 1979) assigned to the same assignee as the instant application, there is disclosed a 40-lead dual-in-line frame and ceramic package, called a 40-lead cer-dip, that features tabs holding at least groups of the longest leads, so that the latter are maintained in precise position during the sealing operation, wherein by means of heat and pressure the leads are embedded in glass on a ceramic substrate. After this sealing, the tabs are snapped off.

Production of such frames may be either by stamping or etching (chemical milling), but for high-volume production stamping is preferred for obvious reasons. The starting material is a strip of alloy 42, Kovar (TM) or other glass-sealing alloy. The alloy may have a stripe of vapor deposited aluminum thereon that covers the area that will ultimately form the lead tips. The first step is to punch index holes so that, in each successive step, the strip is advanced precisely one unit length. Thereafter, the frame is formed gradually in a number of sequential punch and die sets, any one set only stamping out a small number of areas. Ten or more separate stations may be required in an elaborate frame such as the 40-lead cer-dip. Finally, the lead pattern is established, with all of the leads connected at their outer ends to the surrounding frame, and to a central rectangle of metal at their inner tips. Depending on the design, tie bars may also connect the leads. The rectangle, frame and tie bars must of course be removed from the finished package. This is no problem in so-called window frame or multilayer packages, where the ceramic substrate has a central opening slightly larger than the rectangle. After the lead is embedded in one surface of such a substrate, a punch is used to remove the rectangle, frame, etc., leaving each lead electrically isolated. A solid substrate with the bonding pad for the circuit in the center is then sealed to the other surface.

In monolithic packages, however, the substrate has a central cavity or depression and punching out the center area is not possible after sealing, so this operation must be done earlier in the process. This is no problem in simple frames with a small number of leads, since the leads are large enough, and not so long, that they will not move around during sealing. In a 40-lead cer-dip or larger frame, however, the leads may be as small as 0.012 in. on 0.012 in. centers, with some leads having an overall length of more than an inch. They are so fragile that, under conditions of sealing they can and do move around enough to short one lead against another.

The break-off tabs are the solution to this problem, and the present invention is directed to the tools used to produce frames with this feature in a high-volume, high-precision stamping operation.

OBJECTS OF THE INVENTION

A general object of this invention is to provide tools to stamp parts including scored and bent-up portions.

Another object of the pesent invention is to provide tools to stamp complex lead frames with scored and bent-up tabs.

A further object of the invention is to provide means for indexing stamped parts between stations in a sequential stamping operation without interference by the die set.

Various other objects and advantages of the invention will become clear from the following description of embodiments, and the novel features will be particularly pointed out in connection with the appended claims.

THE DRAWINGS

Reference will hereinafter be made to the accompanying drawings, wherein:

FIG. 1 is a cross-sectional elevation, somewhat simplified showing a preferred embodiment of the invention and including four stations of a sequential punch and die set;

FIG. 2 is a partial cross-section, greatly enlarged, illustrating the scoring step at station 3 of FIG. 1;

FIG. 3 is a partial cross-section, greatly enlarged, illustrating preferred lifting means for use at station 4 of FIG. 1, and taken along line 3—3 thereof;

FIG. 4 is a plan view showing tabbed leads and the extent of scoring and coining.

DESCRIPTION OF EMBODIMENTS

The invention is installed in a conventional stamping machine, and attention is directed to FIG. 1, which illustrates a portion of same. A die shoe 10 is secured to the (stationary) bed 11 of the stamper, and a punch shoe 12 is secured to the (reciprocating) ram (not shown). As shown in FIG. 1, four forming stations (1)—(4) are present, but of course more or less stations may be accommodated depending on the size of the press and size of the part. In the production of 40-lead cer-dip frames, for example, the entire operation may be carried out on two in-line punch and die shoes in a single press. Guide pins (not shown) on the punch shoe ride in holes in the die shoe, and carefully adjusted stops (not shown) provide a highly accurate stroke length.

At station (1), a cutout punch 14 cooperates with a die 16 to remove the center of the lead frame except for two tabs 18 (FIG. 4); thus, punch 14 has a general "H" shape.

At stations (2)-(4), a pair of channels 20,22 are provided, and at station (2) a forming punch 24 bends the sides of the lead frame, including leads 26 and frame 28 of workpiece 29 down thereover, in the well-known dual-in-line configuration.

At station (3) a scoring and coining punch 30 carries out these functions in a scoring die 32, as discussed hereinbelow in connection with FIG. 2, and at station (4) a bending punch 34 and die 36 bend the tabs upwardly, as discussed in connection with FIG. 3.

Thereafter, a spring-mounted chopper blade (not shown) may be used to cut the frames into individual units. Alternatively a solinoid-actuated arm may be interposed at intervals so that the chopper cuts the frames only every five or ten strokes.

The punch shoe 12 is also provided with spring-mounted guide-stripper plate 38, which prevents the work-pieces from "sticking" to the punches on each up-stroke. Bridges 40,42 may be provided at stations where this tendency is particularly strong. Also, pilots 44 are provided at various locations (one shown) to insure that registration of the workpiece is exact at all times. Except for specific punch and die designs, all of the foregoing is substantially conventional and well known in the stamping art.

As noted hereinabove, scoring at station (3) and bending at station (4) could "hand-up" workpiece 29, and the present invention is directed to means for overcoming this without impairing either the speed or precision of the stamping operation.

FIG. 2 illustrates scoring and coining at station (3). In particular die 32 is seen to be generally rivet shaped (albiet square or rectangular in cross-section) having a shoulder 46. Die 32 is spring mounted 48 in a cavity 50 in die shoe 10, and cavity 50 includes shoulder 52 against which shoulder 46 will be pressed by spring 48. In the rest position, the top surface 54 of die 32 is flush with the surface of die shoe 10. On each downward stroke of scoring punch 30, die 32 is pushed downward a few ten-thousandths, and tabs 18 are scored along a line 55. As reference to FIG. 4 makes clear, it is not actually the tabs 18 that are scored at 55, but rather the lead tips just adjacent the tabs 18. At the same time, punch 30 also coins the lead tips, to insure flatness, in the area (x) where wire bonding will ultimately occur. As the ram lifts, spring 48 expands and pushes die 32 back to the flush position. The indexing drive (not shown) can then advance workpiece 29 without any problem.

At tab bending station (4), the problem is not just one of hanging-up workpiece 29. As a matter of fact, if the ramp angle (e.g. the angle to which the tabs are to be bent) is sufficiently small (less than 35°), the indexing drive will push workpiece 29 onto moveable die 36 and off of it after the bending stroke. It does so, however, at a substantial cost. More particularly, presser-stripper plate 38 clamps workpiece 29 to die shoe 10 a fraction of a second before punch 34 bends the tabs. Because of the necessary clearance between the opening 56 (FIG. 1) in plate 38 and punch 34, the clamping action of plate 38 tends to induce a bend in the leads 26 at opening 56. While punch 34 subsequently bends tabs 18 only and flattens leads 26, they tend to "remember" the initial bend occasioned by opening 56 and spring-back, even if only slightly. Such elastic behavior can exceed tolerances allowed in the sealing operation, and ruin a part. Accordingly, means are required both to prevent possible hang-up of workpiece 29, and also avoid the type of elastic bending described. Because die 36 is an actual forming surface, the simple spring mounting of die 32 is not satisfactory.

The solution to this problem is illustrated in FIG. 3, and attention is directed thereto. Tab-bending die 36 is also generally rivet shaped, having a shoulder 58 at the bottom end, and it is also spring mounted, but in this instance spring 57, which rests against shoulder 58 and the bottom of die shoe 10, biases die 36 in the lower position, with the top surface thereof flush with the surface of die shoe 10. Die 36 also presses on one end 60 of rocker arm 62, which is pivoted at 64. A gage block 66 in the bottom of hole 68 supports end 60 of arm 62, and insures the accurate positioning of the top surface (e.g. flush). A connecting rod 70 in a separate hole 72 rests on the opposite end 74 of rocker arm 64, and extends substantially above the surface of die shoe 10. A corresponding push-pin (not shown) is provided on punch shoe 12 to activate the mechanism.

During indexing, there is nothing to impede the motion of workpiece 29. As the ram descends, presser-stripper plate 38 first clamps workpiece 29, but since the working surface is still flush, there is no tendency toward bending. As punch 34 descends, the push-pin hits connecting rod 70, and rocker arm 62 raises die 36 to the operative position, and the tabs 18 are bent by the compound action of die 36 rising to the operative position and punch 34 descending to bend the tabs sharply, along the score line, thereover. Spring 57 is compressed. As the ram rises, spring 57 expands and returns die 36 to the normal (flush) position.

While hang-up of workpiece 29 is not a problem per se in the case illustrated, it obviously would be if the desired ramp angle was high (e.g. 90°). A variety of spring-biased mechanisms could be provided to merely raise workpiece 29 thereover, but this would not overcome the elastic bending problem discussed above. Thus, while other mechanisms (hydraulic, electromagnetic) could be employed to raise the forming die with enough force to withstand the bending blow, it is considered essential that the die itself move from a flush position to a working position and back.

Various other changes in the details, steps, materials and arrangements of parts, which have been herein described and illustrated in order to explain the nature of the invention, may be made by those skilled in the art within the principle and scope of the invention as defined in the appended claims.

We claim:

1. Stamping tools for carrying out scoring and bending functions comprising:

a scoring punch and a bending punch mounted in a punch shoe in spaced relation for sequential operation on a workpiece;

a scoring die mounted in a die shoe beneath said scoring punch, said scoring die being biased to an upper position flush with said die shoe surface and adapted to retract during each scoring stroke;

a bending die mounted in said die shoe beneath said bending punch, said bending die being biased to a lower position no higher than flush with said die shoe surface and adapted to be raised to and supported in a working position during each bending stroke.

2. The stamping tools are claimed in claim 1, and further comprising a spring to bias said scoring die against a shoulder in said die shoe.

3. The stamping tools as claimed in claim 1, and further comprising:

a pivoted rocker arm having said bending die above one end thereof;

spring means biasing said bending die against said rocker arm;

ram-actuated connecting rod means resting against the other end of said rocker arm;

whereby said bending die is raised to and supported in said working position with each ram stroke.

4. The stamping tools as claimed in claim 1, and additionally comprising coining punch means surrounding said scoring punch.

5. Stamping tools in a punch shoe and a die shoe for producing lead frames having scored and bent tabs retaining the inner tips of at least groups of said leads comprising:

a first punch and die set adapted to stamp out a central portion of an incomplete frame except for desired tabs;

a second punch and die set adapted to score said leads adjacent said tabs;

a bias element in said second die biasing said scoring die in an upper position flush with said die surface, and is adapted to retract during each scoring stroke;

a third punch and die set adapted to bend said tabs upwardly along said score line;

a bias element in said third die biasing said bending die in a lower position no higher than said die surface;

a pivoted rocker arm having said bending die above one end thereof;

spring means biasing said bending die against said rocker arm;

ram-actuated connecting rod means resting against the other end of said rocker arm;

whereby said bending die is raised to and supported in said working position with each ram stroke;

Said biased die elements acting so that work-pieces may be indexed from set to set without interference.

6. The stamping tools as claimed in claim 5, and additionally comprising coining punch means integral with and surrounding said scoring punch.

* * * * *